(12) United States Patent
Inui

(10) Patent No.: US 8,416,362 B2
(45) Date of Patent: Apr. 9, 2013

(54) ELECTRIC CIRCUIT STRUCTURE INCLUDING A FLEXIBLE SUBSTRATE WITH A CONNECTING TERMINAL

(75) Inventor: Tadashi Inui, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/003,019

(22) PCT Filed: Jul. 15, 2009

(86) PCT No.: PCT/JP2009/062794
§ 371 (c)(1),
(2), (4) Date: Jan. 7, 2011

(87) PCT Pub. No.: WO2010/008016
PCT Pub. Date: Jan. 21, 2010

(65) Prior Publication Data
US 2011/0116003 A1    May 19, 2011

(30) Foreign Application Priority Data

Jul. 18, 2008    (JP) .................................. 2008-187519

(51) Int. Cl.
*G02F 1/1333*    (2006.01)
*G02F 1/1343*    (2006.01)
*H05K 5/00*    (2006.01)

(52) U.S. Cl.
USPC .............. 349/60; 349/138; 349/150; 361/757

(58) Field of Classification Search .................... 349/58, 349/60, 138, 150; 361/757
See application file for complete search history.

(56) References Cited

U.S. PATENT DOCUMENTS

| 5,561,539 A | 10/1996 | Funahata et al. |
| 5,822,030 A | 10/1998 | Uchiyama |

(Continued)

FOREIGN PATENT DOCUMENTS

| JP | 3-29923 A | 2/1991 |
| JP | 2001-91969 A | 4/2001 |

(Continued)

OTHER PUBLICATIONS

Official Communication issued in corresponding Russian Patent Application No. 2011101588, mailed on Jul. 3, 2012. X.

(Continued)

*Primary Examiner* — Uyen Chau N Le
*Assistant Examiner* — Michael Mooney
(74) *Attorney, Agent, or Firm* — Keating & Bennett, LLP

(57) ABSTRACT

To provide an electric circuit structure with which the occurrence of sound generation caused by vibration of a circuit element mounted on a flexible substrate connected to a circuit board is suppressed. The electric circuit structure includes a mechanical member (9) in the form of a frame having a closed bottom; a circuit board (1) on the surface of which an electric circuit element is formed, the circuit board being accommodated in the mechanical member (9); a flexible substrate (10) that has a connecting terminal formed on one end (10*a*) thereof, the connecting terminal being connected to an electrode terminal (7) formed on the circuit board (1), and that is folded back and fixed to a rear face of the mechanical member (9) at the other end opposite to the one end (10*a*); and a circuit element mounted on a portion of the flexible substrate (10) that is folded back to the rear face of the mechanical member (9), wherein the flexible substrate (10) is fixed to the rear face of the mechanical member (9) via a nonwoven fabric adhesive tape employing a nonwoven fabric as a base material.

5 Claims, 4 Drawing Sheets

U.S. PATENT DOCUMENTS

| | | |
|---|---|---|
| 6,848,617 B1 | 2/2005 | Fries et al. |
| 2002/0007906 A1 | 1/2002 | Droz |
| 2003/0231275 A1 | 12/2003 | Shirato et al. |
| 2005/0088830 A1 | 4/2005 | Yumoto et al. |
| 2008/0076310 A1 | 3/2008 | Kishioka et al. |

FOREIGN PATENT DOCUMENTS

| | | |
|---|---|---|
| JP | 2002-207222 A | 7/2002 |
| JP | 2004-20703 A | 1/2004 |
| JP | 2005-115337 A | 4/2005 |
| JP | 2006-235453 A | 9/2006 |
| JP | 2008-74954 A | 4/2008 |
| RU | 2 171 497 C2 | 7/2001 |
| RU | 2 198 427 C2 | 2/2003 |

OTHER PUBLICATIONS

Official Communication issued in International Patent Application No. PCT/JP2009/062794, mailed on Oct. 20, 2009.

US 8,416,362 B2

ELECTRIC CIRCUIT STRUCTURE INCLUDING A FLEXIBLE SUBSTRATE WITH A CONNECTING TERMINAL

TECHNICAL FIELD

The present invention relates to an electric circuit structure, such as a liquid crystal display apparatus, in which a circuit element is mounted on a flexible substrate connected to a circuit board, and particularly relates to an electric circuit structure with which noise due to vibration of the circuit element mounted on the flexible substrate is reduced.

BACKGROUND ART

A panel substrate that constitutes a flat image display device such as a liquid crystal panel serves as a circuit board on the inner surface of which electric circuit elements such as electrodes that function as pixels and metal wiring are formed. In particular, with respect to an active matrix substrate that is used to display a higher-definition and highly-responsive image, switching elements such as TFTs are formed and, for example, COG (Chip On Glass) technology that forms part of a driving circuit on the panel is adopted.

The panel substrate of a liquid crystal panel is provided with electrode terminals for external connection, and various types of signals for image display and a power supply voltage that is necessary for the panel substrate to operate as a circuit board are supplied, for example, from a peripheral circuit board other than the liquid crystal panel by a flexible substrate connected to the electrode terminals. Moreover, the liquid crystal panel, the peripheral circuit board, and furthermore, a backlight and the like are accommodated in a mechanical member, which is called a bezel, in the form of a frame having a closed bottom, and thus, a liquid crystal display apparatus as an electric circuit structure is configured.

Connecting terminals on one end of the flexible substrate are joined to the electrode terminals of the panel substrate, and the other end of the flexible substrate is folded back to the rear face side of the bezel so as to conform to a side face of the bezel accommodating the liquid crystal panel and is fixed to the rear face of the bezel. Moreover, a circuit element such as a capacitor is mounted on the flexible substrate via a hard resin substrate, if necessary (see Patent Document 1, for example).

Citation List
Patent Document
  Patent Document 1; JP 2004-020703A

DISCLOSURE OF INVENTION

Problems to be Solved by the Invention

In the above-described conventional liquid crystal display apparatus, the circuit element mounted on the flexible substrate may vibrate during operation of the liquid crystal display apparatus and generate noise. In particular, in the case where an electrolytic capacitor is mounted on the flexible substrate, laminated foil electrodes within the capacitor vibrate when the capacitor is charged and discharged in accordance with the operation of the liquid crystal display apparatus, and this vibration is transmitted from a container of the capacitor to the hard resin substrate on which the capacitor is mounted, and is further conveyed to the mechanical member of the liquid crystal display apparatus, thereby causing a phenomenon called sound generation in which this vibration makes a loud acoustic noise that a user can perceive.

Thus, in view of the above-described problem, it is an object of the present invention to provide an electric circuit structure with which the occurrence of sound generation caused by the vibration of the circuit element mounted on the flexible substrate connected to the circuit board is suppressed, and a liquid crystal display apparatus in which the circuit board is a panel substrate that constitutes a liquid crystal panel in conjunction with an opposing substrate.

Means for Solving Problems

In order to solve the above-described problem, an electric circuit structure of the present invention includes a mechanical member in the form of a frame having a closed bottom; a circuit board on the surface of which an electric circuit element is formed, the circuit board being accommodated in the mechanical member; a flexible substrate that has a connecting terminal formed on one end of the flexible substrate, the connecting terminal being connected to an electrode terminal formed on the circuit board, and that is folded back and fixed to a rear face of the mechanical member at the other end opposite to the one end; and a circuit element mounted on a portion of the flexible substrate that is folded back to the rear face of the mechanical member, wherein the flexible substrate is fixed to the rear face of the mechanical member via a nonwoven fabric adhesive tape employing a nonwoven fabric as a base material.

Effects of the Invention

According to the present invention, it is possible to obtain an electric circuit structure with which vibration of a circuit element mounted on a flexible substrate, which is generated during operation, can be absorbed and reduced and the occurrence of sound generation that is perceived by the user as acoustic noise can be effectively prevented.

BRIEF DESCRIPTION OF DRAWINGS

FIG. 4 illustrates a cross-sectional configuration of a second example of the configuration for fixing the flexible substrate of the liquid crystal display apparatus according to the embodiment of the present invention, where

DESCRIPTION OF THE INVENTION

Figure 1:
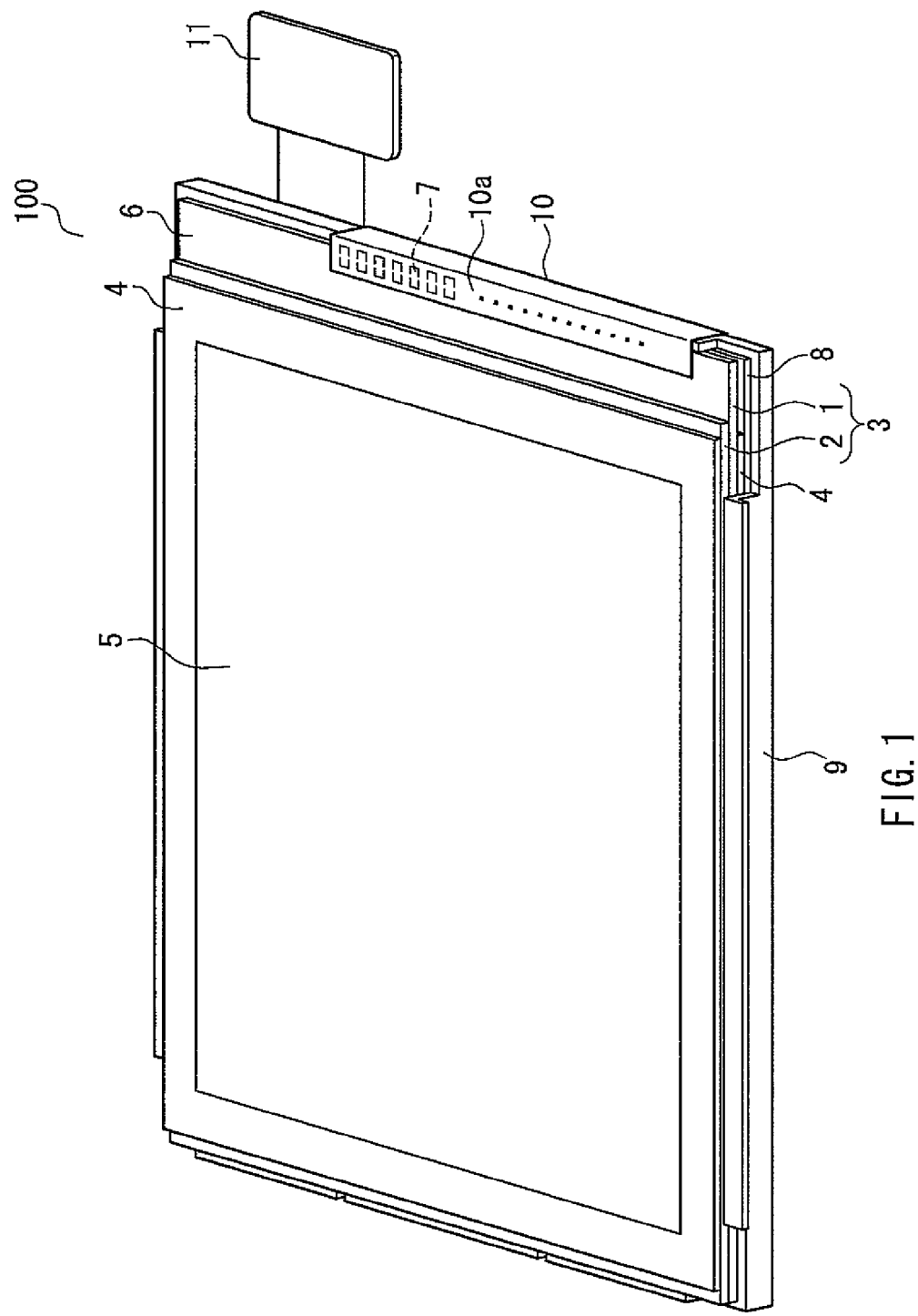
FIG. 1 is a perspective view showing the configuration of a liquid crystal display apparatus according to an embodiment of the present invention.

An electric circuit structure according to the present invention includes a mechanical member in the form of a frame having a closed bottom; a circuit board on the surface of which an electric circuit element is formed, the circuit board being accommodated in the mechanical member; a flexible substrate that has a connecting terminal formed on one end of the flexible substrate, the connecting terminal being connected to an electrode terminal formed on the circuit board, and that is folded back and fixed to a rear face of the mechanical member at the other end opposite to the one end; and a circuit element mounted on a portion of the flexible substrate that is folded back to the rear face of the mechanical member, wherein the flexible substrate is fixed to the rear face of the mechanical member via a nonwoven fabric adhesive tape employing a nonwoven fabric as a base material.

With this configuration, even when vibration occurs in the circuit element mounted on the flexible substrate during operation of the electric circuit structure, the nonwoven fabric, which is the base material for the tape that fixes the flexible substrate to the mechanical member, absorbs and reduces this vibration. Thus, it is possible to effectively prevent the occurrence of sound generation, in which the vibration of the circuit element mounted on the flexible substrate is transmitted to the mechanical member and becomes significant, and thus is perceived by the user as acoustic noise.

In the electric circuit structure having the above-described configuration, it is desirable that the circuit element is mounted on a hard resin substrate laminated on the flexible substrate. This allows the circuit element to be reliably mounted.

Moreover, it is preferable that the circuit element is a capacitor.

Furthermore, it is preferable that a silicon resin layer is formed between the nonwoven fabric adhesive tape and the flexible substrate. This allows the flexible substrate and the nonwoven fabric adhesive tape to be fixed to each other with no space between them even in the case where the flexible substrate is curved.

Moreover, it is preferable that the electric circuit structure is a liquid crystal display apparatus, and the circuit board is a panel substrate that constitutes a liquid crystal panel in conjunction with an opposing substrate that is fixed to the panel substrate at a predetermined distance therefrom with a liquid crystal layer sandwiched between the substrates. By employing this configuration, it is possible to effectively reduce the vibration of the circuit element mounted on the flexible substrate and obtain a liquid crystal display apparatus that does not cause the sound generation phenomenon.

Moreover, in the above-described configuration, it is preferable that the circuit board is an active matrix substrate.

Hereinafter, an embodiment of the present invention will be described with reference to the drawings.

In the following description of the embodiment of the present invention, a configuration example in the case where an electric circuit structure according to the present invention is implemented as a liquid crystal display apparatus that is used as a display of a mobile telephone or a mobile device is presented. However, it should be construed that the following description does not limit the application of the electric circuit structure according to the present invention. The electric circuit structure of the present invention is not limited to such a liquid crystal display apparatus and can be widely applied to various types of flat display apparatuses such as an organic or inorganic EL display and a field-emission cold-cathode display apparatus. Furthermore, the electric circuit structure of the present invention can be applied not only to the above-described display apparatus module but to various types of circuit modules, such as a driving circuit of an acoustic apparatus or an information processing apparatus, that include a circuit board to whose electrode terminals a flexible substrate on which a circuit element is mounted is connected, the circuit board being accommodated in and integral with a mechanical member. Moreover, even in the case where the electric circuit structure is used as a liquid crystal display apparatus, the application thereof is not limited to the display for a mobile telephone or a mobile device, and the electric circuit structure also can be used as various types of monitors such as those of personal computers or televisions.

It should be noted that for convenience of description, the drawings that will be referenced below show, in a simplified manner, only main members that are necessary to describe the present invention among components of the embodiment of the present invention. Therefore, the display apparatus according to the present invention can include any desired component that is not shown in the drawings to be referenced. Moreover, the dimensions of each member in the drawings do not faithfully represent the dimensions of actual components, dimension ratios of the components, and the like.

FIG. 1 is a perspective view of a liquid crystal display apparatus according to the embodiment of the present invention.

A liquid crystal display apparatus 100 of the present embodiment has a liquid crystal panel 3 constituted by a panel substrate 1 serving as a circuit board and an opposing substrate 2 that is disposed facing the panel substrate with a predetermined distance between each other. A pair of polarizing plates 4 is attached to both outer faces of the liquid crystal panel 3, that is, an outside face of the panel substrate 1 and an outside face of the opposing substrate 2.

The panel substrate 1 is an active matrix substrate, in which pixel electrodes (not shown) arranged in a matrix pattern so as to form a plurality of rows and a plurality of columns are placed on a surface of the panel substrate 1 facing the opposing substrate 2, and the pixel electrodes form a display region 5 of the liquid crystal panel 3 where an image is displayed. A plurality of gate lines arranged in the direction of the rows of the pixel electrodes, a plurality of source lines arranged in the direction of the columns of the pixel electrodes, and furthermore, TFTs that are arranged in the vicinity of the points of intersection of the rows and columns intersecting at right angles and that are connected to the respective pixel electrodes are formed in the display region 5 of the panel substrate 1. The gate lines, source lines, and TFTs also are omitted from the drawings.

Moreover, a sealing material for fixing the panel substrate 1 and the opposing substrate 2 to each other and a liquid crystal layer sandwiched between the panel substrate 1 and the opposing substrate 2 also are omitted from the drawings.

The panel substrate 1, which has a slightly larger surface area than the opposing substrate 2, has a packaging region 6 where the surface of the panel substrate is exposed. Electrode terminals 7 for applying a predetermined voltage or signal to electric circuit elements such as various types of wiring, such as the gate lines and the source lines formed on the surface of the panel substrate 1, and the TFTs are formed in the packaging region 6. Moreover, in the case where the COG (Chip On Glass) technology is adopted, a driving semiconductor element for driving the liquid crystal panel 3 and the like will be mounted in this packaging region 6.

A backlight 8 that emits illumination light that is necessary to display an image on the liquid crystal panel 3 is disposed on a back side of the liquid crystal panel 3. Although details are omitted in FIG. 1, the backlight 8 of the liquid crystal display apparatus 100 of the present embodiment, for example, is of a type called a sidelight type or edge-light type and is constituted by a flat plate-like light guide and a light source, such as a cold cathode fluorescent tube or a light emitting diode, provided on a side face of the light guide. Illumination light from the light source that has entered the light guide through the side face thereof is repeatedly reflected within the light guide, thus diffused and propagated, and emitted as uniform light from a principal plane of the light guide on the side facing the liquid crystal panel 3.

It should be noted that the backlight 8 of the liquid crystal display apparatus according to the present invention is not limited to the above-described sidelight type, and it is also possible to use a type called a direct type in which light sources are arranged on the back side of the liquid crystal panel 3 in a planar manner so as to emit light toward the liquid crystal panel 3, and illumination light from the light sources is radiated on the liquid crystal panel via an optical sheet such as a light concentrating sheet or a diffusion sheet. Moreover, also the light source is not limited to the cold cathode fluorescent tube or the light emitting diode, and various types of light sources, such as a hot cathode fluorescent tube and an EL light emitter, can be used. Furthermore, also the liquid crystal panel 3 is not limited to those called a transmissive type or a semi-transmissive type that use illumination light from the backlight 8 to display an image, and the liquid crystal panel 3 of a reflective type in which external light entering through the opposing substrate 2 of the liquid crystal panel 3 is reflected by reflecting electrodes formed on the panel substrate 1 and used to display an image can be employed, in which case the necessity for the backlight 8 itself is eliminated.

The liquid crystal panel 3 and the backlight 8 are accommodated in a bezel 9, which is a mechanical member in the form of a frame having a closed bottom. The bezel 9 is required to be light weight and ensure a certain degree of strength, and is therefore made of a metal such as aluminum or a resin such as plastic.

It should be noted that, for example, a protrusion (not shown) for holding the liquid crystal panel 3 and the backlight 8 to be accommodated in the bezel may be formed on the inside of a side wall of the bezel 9, and moreover, a protrusion or a depression for fixing the bezel 9 to a frame of an image display portion of a device such as a mobile telephone or a mobile device may be provided on the image display surface side of the liquid crystal panel 3, that is, at an upper end portion in FIG. 1. Furthermore, an opening may be formed in a side wall portion or a bottom portion of the bezel 9 in order to release heat generated from the backlight 8 and various types of circuit components accommodated in the bezel to the outside or in order to reduce the weight of the bezel 9 itself.

A flexible substrate 10 for applying a signal or a voltage for operating the liquid crystal panel 3 is connected to the electrode terminals 7 formed in the packaging region 6 of the panel substrate 1. This flexible substrate 10 is also called an FPC (Flexible Print Circuit) and has a three-layer structure in which micro wiring formed from copper foil or the like is sandwiched between flexible resin films. At one end 10*a* of the flexible substrate 10, connecting portions (not shown) where the internal copper foil is exposed are formed at positions corresponding to the locations of the electrode terminals 7 formed in the packaging region 6 of the panel substrate 1, and an electrical connection is established by fixing the flexible substrate while aligning the positions of the electrode terminals 7 with the positions of the connecting portions. In order to physically fix the electrode terminals 7 of the panel substrate 1 to the connecting portions of the flexible substrate 10 and establish an electrical connection at the same time, a film material, which is called an anisotropic conductive resin (ACF: Anisotropic Conductive Film), containing conductive particles is used.

The liquid crystal display apparatus 100 is produced as a module, which is an integrated electric circuit structure, capable of performing image display simply by inputting a predetermined power supply and signal from the outside, and has a control portion 11 in which a semiconductor integrated circuit for performing overall control of the liquid crystal display apparatus 100 is formed.

Next, mounting of a circuit element onto the flexible substrate 10 and a method for fixing the flexible substrate 10 to the bezel 9, of the liquid crystal display apparatus 100 of the present embodiment, will be described.

Figure 2:
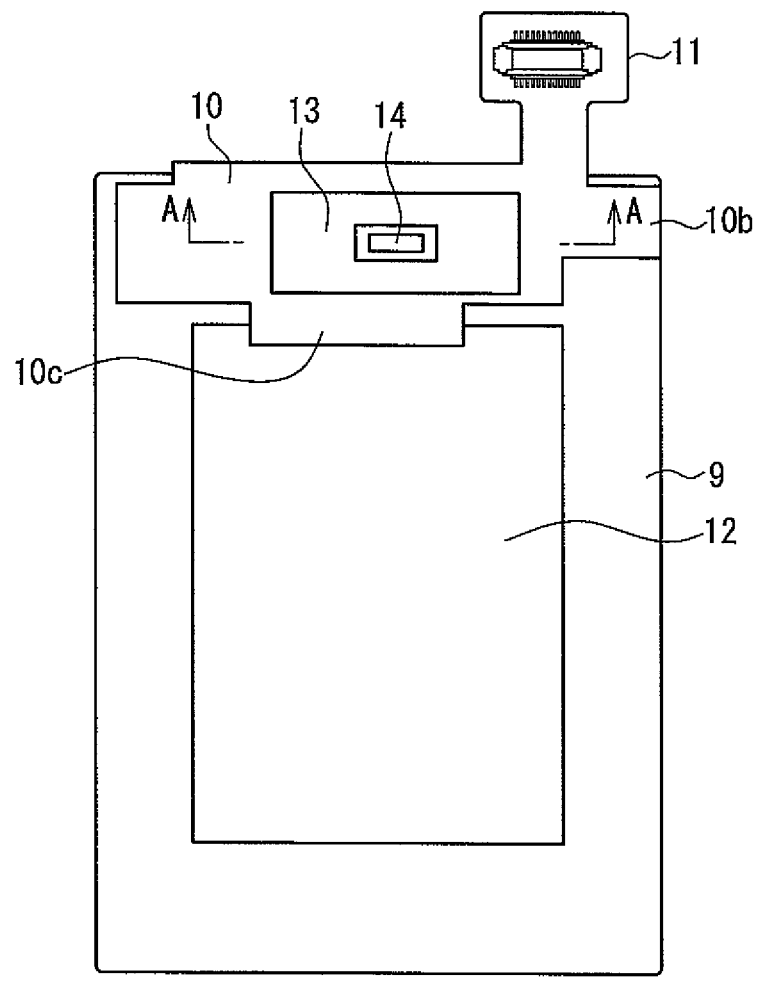
FIG. 2 is a plan view showing a rear face of the liquid crystal display apparatus according to the embodiment of the present invention.

FIG. 2 is a plan view when the liquid crystal display apparatus 100 of the present embodiment is seen from the rear face, that is, the underside of the image display surface.

As shown in FIG. 2, the flexible substrate 10 whose end 10*a* is connected to the panel substrate 1 on the image display surface side of the liquid crystal display apparatus 100 is folded back to the rear face side along a side face of the bezel 9. The flexible substrate 10 has such a shape that part of the bezel 9 is covered with the other end 10*b* opposite to the end 10*a*, and is fixed to a rear face of the bezel 9 at this end 10*b*. It should be noted that in order to reduce the external size of the liquid crystal display apparatus 100 and also to prevent, for example, a break in the copper foil wiring due to damage to the flexible substrate 10 caused by rubbing during fixing of the liquid crystal display apparatus 100 as the module to the frame of the image display portion of a device such as a mobile telephone or a mobile device, it is preferable that the flexible substrate 10 is in close contact with the side face of the bezel 9.

A rear circuit board 12 on which a signal circuit for processing an image signal to be displayed on the liquid crystal panel 3, a driving circuit of the backlight 8 incorporated in the bezel 9, and the like are mounted is disposed on the rear face of the bezel 9, and a protruding portion 10*c* formed in the end 10*b* of the flexible substrate 10 is connected to the rear circuit board.

A capacitor 14, which is a circuit element, is mounted on the end 10*b* of the flexible substrate 10 via a resin substrate 13 employing a hard resin as a base material, for example, a polycarbonate substrate. Moreover, part of the flexible substrate 10 extends to the control portion 11.

Next, a portion where the end 10*b* of the flexible substrate 10 is fixed to the rear face of the bezel 9 will be described using FIG. 3.

Figure 3:
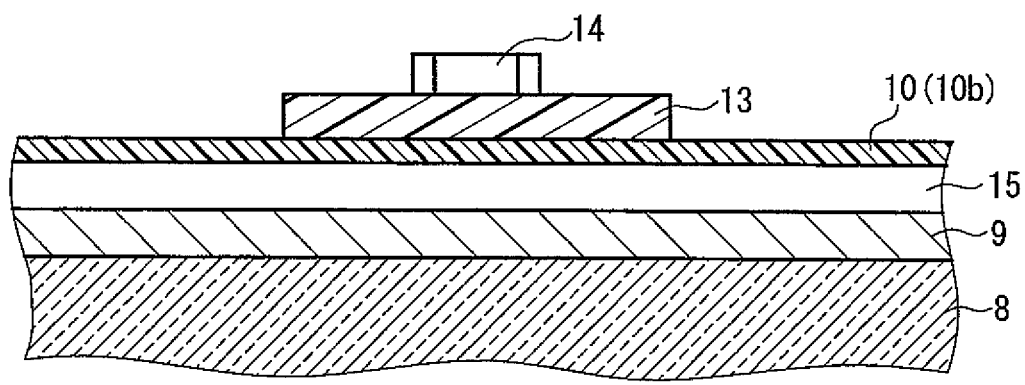
FIG. 3 is a cross-sectional configuration diagram showing a first example of a configuration for fixing a flexible substrate of the liquid crystal display apparatus according to the embodiment of the present invention.

FIG. 3 is a cross-sectional configuration diagram showing a cross section as seen in the direction of arrow A-A in FIG. 2 and shows an example of the configuration of a portion where the end 10*b* of the flexible substrate 10 is fixed to the rear face of the bezel 9 and where the capacitor 14 is mounted on the flexible substrate 10 via the resin substrate 13.

As shown in FIG. 3, the hard resin substrate 13 is laminated on the flexible substrate 10, and the capacitor 14, which is the circuit element, is mounted on the resin substrate 13.

A circuit pattern for supporting the mounted capacitor 14 and other circuit elements is formed on the upper face side of the resin substrate 13, and a circuit pattern corresponding to a wiring pattern of the flexible substrate 10 is formed on the lower face side. For example, an MCM (multi-chip module) substrate can be used as the resin substrate 13. Moreover, a substrate in which wiring patterns are formed on both faces of a base material such as polycarbonate, which is a common material for a circuit board, a substrate that is a laminate of a plurality pieces of substrates, or the like can be used as the resin substrate 13.

The capacitor 14 and other circuit elements can be fixed to the resin substrate 13 using ordinary solder. Moreover, the resin substrate 13 and the flexible substrate 10 can be fixed to each other using soldering connection that employs solder bumps or the like with electrode patterns formed on the surfaces of the respective substrates aligned with each other.

The flexible substrate 10 on which the circuit elements such as the capacitor 14 are mounted via the resin substrate 13 is bonded to the rear face of the bezel 9 via a nonwoven fabric adhesive tape 15 employing a nonwoven fabric (also called an "unwoven fabric") as a base material. This nonwoven fabric adhesive tape 15 is a double-sided tape produced by infiltrating a nonwoven fabric made of a synthetic fiber such as polypropylene or polyester and having a thickness of 0.145 mm with an adhesive material.

In FIG. 3, the inside of the bezel 9 is shown up to the backlight 8, and the liquid crystal panel 3 that is disposed below the backlight 8 is omitted.

In the liquid crystal display apparatus 100 of the present embodiment, the flexible substrate 10 to which the circuit elements such as the capacitor 14 are fixed via the resin substrate 13 is fixed to the rear face of the bezel 9 with the nonwoven fabric adhesive tape 15 employing a soft nonwoven fabric as a base material. Thus, even in the case where switching on/off of an electric signal to be applied causes an electrode of the capacitor 14 to deform in the direction of an electric field of the signal and thus generate vibration, this vibration is absorbed without being conveyed from the flexible substrate 10 to the bezel 9. In particular, in the case where the panel substrate 1 is an active matrix substrate and the liquid crystal panel 3 is driven by active matrix driving, when a control voltage of a driving circuit thereof is applied to the capacitor 14, a sound generation phenomenon, in which vibration of the capacitor 14 causes the bezel 9 to resonate and makes a loud sound, and the user perceives the sound, is likely to occur. However, with the liquid crystal display apparatus 100 of the present embodiment, the occurrence of this sound generation can be effectively prevented.

Specifically, noise that was generated when switching on/off of a power supply was repeated at a frequency of 0 Hz to 20 Hz in the case of an example, which is described above as the embodiment, in which a nonwoven fabric adhesive tape employing a nonwoven fabric having a thickness of 0.145 mm as a base material was used as the adhesive tape 15 for fixing the flexible substrate 10 to the bezel 9 was compared with that in the case of a comparative example in which an adhesive tape employing ordinary polyethylene terephthalate (PET) as a base material was used. As a result, with respect to an average value of n=16 samples, the peak value of vibration was 3.85 dBVr. in the case of the example, that is, the nonwoven fabric adhesive tape 15 employing the nonwoven fabric as the base material, whereas an acoustic noise at 15.80 dBVr. was observed in the case of the comparative example, that is, the adhesive tape employing PET as the base material. It was possible to reduce the noise level by 12.34 dBVr. to one third or less of the noise level in the case of the comparative example by using the nonwoven fabric adhesive tape 15 employing the nonwoven fabric as the base material.

For example, a nonwoven fabric-based double-sided adhesive tape "#8800CH(W)" (trade name) having a thickness of 0.145 mm manufactured by Dainippon Ink and Chemicals, Inc., a strong-type nonwoven fabric double-sided tape "No. 7566" (product number) having a thickness of 0.160 mm manufactured by Teraoka Seisakusho Co., Ltd., and the like can be used as the nonwoven fabric adhesive tape 15 described in the present embodiment. Moreover, these are not limitations, and, for example, a nonwoven fabric adhesive tape obtained by impregnating a nonwoven fabric produced, for example, by chemical bonding with an acrylic ester copolymer adhesive can be preferably used.

Moreover, since the nonwoven fabric adhesive tape 15 used in the present embodiment, which is obtained by impregnating the nonwoven fabric serving as a base material with an adhesive, is a double-sided tape, the flexible substrate 10 can be extremely easily bonded to the bezel 9. Specifically, the nonwoven fabric adhesive tape 15 is first attached to a region of a bottom face of the bezel 9 to which the flexible substrate 10 is to be fixed, the flexible substrate 10 is superposed on top of the adhesive tape, and the flexible substrate 10 is pressed down with a pressure of about 300 g to 900 g, whereby a practically sufficient degree of bond strength can be achieved. It should be noted that the pressure with which the flexible substrate 10 is pressed down can be determined as appropriate taking the size (area) of the hard resin board 13 fixed to the flexible substrate 10 or the size, weight, number, arrangement density, or the like of the mounted circuit elements such as the capacitor 14 into consideration. Moreover, it is also possible to attach the nonwoven fabric adhesive tape 15 to the back face of the flexible substrate 10 beforehand and then presses the flexible substrate against the rear face of the bezel 9 with a predetermined pressure to thereby fix the flexible substrate to the bezel.

Next, another example with respect to the configuration of the portion where the end 10b of the flexible substrate 10 is fixed to the rear face of the bezel 9 will be described using FIG. 4.

Figure 4A:
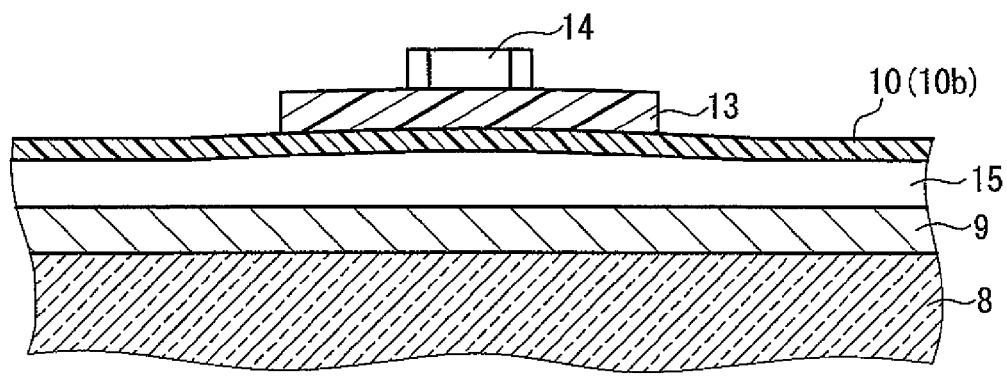
FIG. 4(a) shows a case in which the flexible substrate is slightly warped.
Figure 4B:
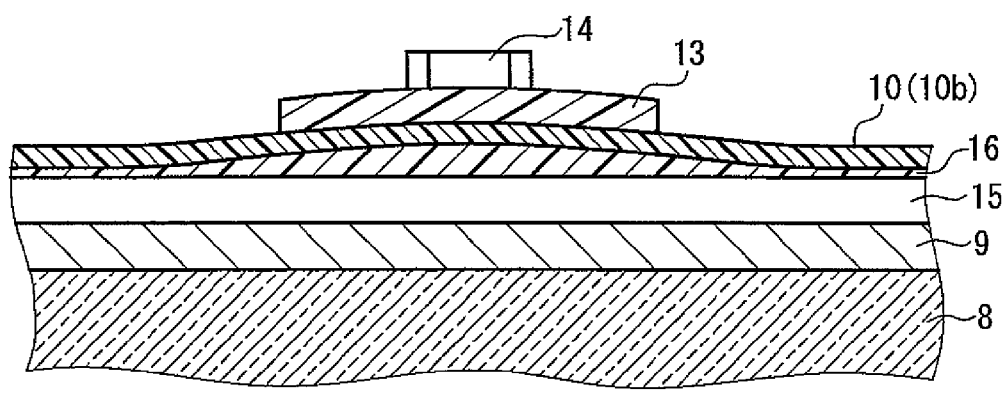
FIG. 4(b) shows a case in which the flexible substrate is relatively significantly warped.

FIGS. 4(a) and 4(b) are both cross-sectional configuration diagrams showing the portion where the flexible substrate 10 is fixed to the bezel 9 and show, as in FIG. 3, the configuration of the portion where the capacitor 14 is mounted on the flexible substrate 10 via the resin substrate 13, that is, the portion as seen in the direction of arrow A-A in FIG. 2. Moreover, in FIGS. 4(a) and 4(b), since the mount state of the capacitor 14 on the flexible substrate 10 and the internal configuration of the bezel 9 are the same as those in FIG. 3, the components in FIGS. 4(a) and 4(b) are denoted by the same reference numerals as those in FIG. 3, and detailed descriptions thereof are omitted.

FIG. 4(a) shows a state in which the flexible substrate 10 is curved along the curvature of the resin substrate 13 fixed to the surface thereof.

The capacitor 14 and other circuit elements are mounted on the hard resin substrate 13, and soldering is used as a means for securing electrical connection of the circuit elements and fixing the circuit elements. At this time, when mounting and fixing the circuit elements such as the capacitor 14 onto the resin substrate 13, a method of printing cream solder onto the surface of the resin substrate 13, then mounting the circuit elements such as the capacitor 14 at predetermined positions, placing the substrate in an infrared reflow oven to melt the cream solder, and thus fixing the circuit components all at once is efficient. However, since the temperature in the reflow oven reaches 200° C. or more, warping is likely to occur due to different thermal expansion coefficients of the wiring patterns, mounted components, and the like on the back and front of the resin substrate 13, and this warping remains even after the substrate has returned to room temperature. Moreover, even when the above-described method that uses the infrared reflow oven is not employed, a heat cycle of temporary melting and subsequent cooling of the solder is necessary in order to fix a circuit element onto a substrate by soldering, and it is therefore difficult to completely avoid the warping of the resin substrate 13 due to differences in the thermal expansion of the circuit elements and substrate materials.

If there is warping in the resin substrate 13 fixed to the flexible substrate 10, the portion of the soft flexible substrate 10 that is fixed to the resin substrate 13 deforms so as to conform to the shape of the resin substrate 13. If warping occurs in the flexible substrate 10 in this manner and a gap is created between the flexible substrate and an adhesive tape that fixes the flexible substrate to the bezel 9, vibration of the capacitor 14, which is the mounted circuit element, tends to be transmitted to the bezel 9 as a loud sound.

However, in the liquid crystal display apparatus 100 according to the present embodiment, since the flexible substrate 10 is fixed to the bezel 9 with the nonwoven fabric adhesive tape 15 employing a nonwoven fabric as a base material, the nonwoven fabric adhesive tape 15 itself is soft and can easily adapt to the shape of the flexible substrate 10 even in the case where the flexible substrate is slightly warped as shown in FIG. 4(a), so that no gap is created. Thus, in the liquid crystal display apparatus 100 according to the present embodiment, even when the resin substrate 13 is slightly warped, sound generation caused by the vibration of the capacitor 14, which is the circuit element, can be effectively prevented.

FIG. 4(b) is a cross-sectional configuration diagram showing an example in the case where larger warping than that in FIG. 4(a) has occurred in the resin substrate 13. As described above, in the liquid crystal display apparatus 100 of the present embodiment, the nonwoven fabric adhesive tape 15 employing a nonwoven fabric as a base material is used to fix the flexible substrate 10 to the bezel 9. However, there is a limit to the thickness of the base material, and so in the case where significant warping exceeding, for example, this limit occurs in the resin substrate 13, the gap between the flexible substrate 10 and the adhesive tape cannot be completely filled. Thus, in the case where there is relatively large warping in the resin substrate 13 and the flexible substrate 10 is significantly warped, it is more preferable to apply and form a layer of a silicon resin 16 between the nonwoven fabric adhesive tape 15 and the flexible substrate 10 as shown in FIG. 4(b).

By applying the silicon resin 16 as described above, the creation of the gap between the flexible substrate 10 and the nonwoven fabric adhesive tape 15 can be prevented, and therefore, it is possible to effectively prevent the occurrence of sound generation even in the case where the resin substrate 13 is significantly warped.

Moreover, by applying the silicon resin 16 between the flexible substrate 10 and the nonwoven fabric adhesive tape 15, insulation between the flexible substrate 10 and the bezel 9 or an electrical shielding effect can be improved, particularly in the case where the bezel 9 is made of a metal. Moreover, even in the case where the liquid crystal display apparatus 100 is used in such a manner that the heat cycle is repeatedly applied thereto, a reduction in the adhesiveness of the nonwoven fabric adhesive tape 15 and resulting tendency of the flexible substrate 10 to detach from the bezel 9 can be effectively prevented by applying the silicon resin 16.

In the description of the liquid crystal display apparatus of the present embodiment, only the example in which the circuit elements such as the capacitor 14 are mounted on the flexible substrate 10 via the hard resin substrate 13 is described. However, the present invention is not limited to this example, and TCP (Tape Carrier Package) technology that provides the circuit elements directly on the flexible substrate 10 also can be adopted. Even in this case, sound generation, which is a phenomenon that the vibration of the capacitor 14 is transmitted to the bezel 9 and makes acoustic noise, can be effectively prevented by fixing the flexible substrate 10 to the bezel 9 with the nonwoven fabric adhesive tape 15 employing a nonwoven fabric as a base material.

INDUSTRIAL APPLICABILITY

The present invention is industrially applicable to various applications including a liquid crystal display apparatus, as an electric circuit structure in which a circuit element is mounted on a flexible substrate connected to a circuit board.

The invention claimed is:

1. An electric circuit structure comprising:
   a mechanical member in the shape of a frame including a closed bottom;
   a circuit board on a surface of which an electric circuit element is provided, the circuit board being accommodated in the mechanical member;
   a flexible substrate that includes a connecting terminal arranged on one end of the flexible substrate, the connecting terminal being connected to an electrode terminal provided on the circuit board, and that is folded back and fixed to a rear face of the mechanical member at the other end opposite to the one end; and
   a circuit element mounted on a portion of the flexible substrate that is folded back to the rear face of the mechanical member, wherein
   the flexible substrate is fixed to the rear face of the mechanical member via a nonwoven fabric adhesive tape employing a nonwoven fabric as a base material; and
   a silicon resin layer is arranged between the nonwoven fabric adhesive tape and the flexible substrate.

2. The electric circuit structure according to claim 1, wherein the circuit element is mounted on a hard resin substrate laminated on the flexible substrate.

3. The electric circuit structure according to claim 1, wherein the circuit element is a capacitor.

4. The electric circuit structure according to claim 1, wherein the electric circuit structure is a liquid crystal display apparatus, and
   the circuit board is a panel substrate that constitutes a liquid crystal panel in conjunction with an opposing substrate that is fixed to the panel substrate at a predetermined distance therefrom with a liquid crystal layer sandwiched between the substrates.

5. The electric circuit structure according to claim 4, wherein the panel substrate is an active matrix substrate.

* * * * *